(12) United States Patent
Roy et al.

(10) Patent No.: US 10,497,849 B2
(45) Date of Patent: *Dec. 3, 2019

(54) THERMOELECTRIC POLYMER COMPOSITE, METHOD OF MAKING AND USE OF SAME

(71) Applicants: Sayantan Roy, Houston, TX (US); David Peter Gerrard, Magnolia, TX (US); Oleksandr V. Kuznetsov, Houston, TX (US)

(72) Inventors: Sayantan Roy, Houston, TX (US); David Peter Gerrard, Magnolia, TX (US); Oleksandr V. Kuznetsov, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 181 days.

This patent is subject to a terminal disclaimer.

(21) Appl. No.: 15/420,372

(22) Filed: Jan. 31, 2017

(65) Prior Publication Data

US 2017/0141283 A1 May 18, 2017

Related U.S. Application Data

(63) Continuation of application No. 13/898,521, filed on May 21, 2013, now Pat. No. 9,595,654.

(51) Int. Cl.
*H01L 35/24* (2006.01)
*H01L 35/26* (2006.01)
*H01L 35/34* (2006.01)

(52) U.S. Cl.
CPC ............. *H01L 35/26* (2013.01); *H01L 35/24* (2013.01); *H01L 35/34* (2013.01)

(58) Field of Classification Search
CPC .................................................. H01L 35/02–34
(Continued)

(56) References Cited

U.S. PATENT DOCUMENTS 5,973,050 A * 10/1999 Johnson ............... C08K 3/08
524/439
6,710,238 B1 3/2004 Shingu et al.
(Continued)

OTHER PUBLICATIONS

Parks, (Radiation Crosslinking of Polymers), Feb. 2010.*
(Continued)

*Primary Examiner* — Niki Bakhtiari
(74) *Attorney, Agent, or Firm* — Cantor Colburn LLP

(57) ABSTRACT

A thermoelectric composite includes a plurality of particles comprising a crosslinked polymer having a heat deflection temperature greater than or equal to 200° F. and a segregated network comprising a first filler material which is disposed between the particles to produce a thermoelectric response in response to application of a voltage difference or temperature difference across the thermoelectric composite. The first filler material includes a carbon material, a metal, a metal disposed on a carbon material, or a combination thereof. A process for preparing a thermoelectric article includes combining a first filler material and a plurality of particles comprising a polymer to form a composition and molding the composition to form a thermoelectric article, wherein the thermoelectric article is configured to produce a thermoelectric response in response to application of a voltage difference or temperature difference across the article.

17 Claims, 7 Drawing Sheets

(58) Field of Classification Search
USPC .................................................. 136/200–242
See application file for complete search history.

(56) References Cited

U.S. PATENT DOCUMENTS

| | | | |
|---|---|---|---|
| 2003/0032709 A1* | 2/2003 | Toshima | C08K 3/08 |
| | | | 524/439 |
| 2003/0097845 A1 | 5/2003 | Saunders et al. | |
| 2011/0005564 A1* | 1/2011 | Gruen | H01L 35/22 |
| | | | 136/239 |
| 2011/0186956 A1* | 8/2011 | Hiroshige | H01B 1/02 |
| | | | 257/467 |
| 2013/0009339 A1 | 1/2013 | Ren et al. | |
| 2013/0062049 A1 | 3/2013 | Ren et al. | |
| 2013/0079427 A1 | 3/2013 | Duan et al. | |
| 2013/0168894 A1 | 7/2013 | Ren et al. | |
| 2014/0338715 A1 | 11/2014 | Grunlan et al. | |
| 2014/0345661 A1 | 11/2014 | Roy et al. | |

OTHER PUBLICATIONS

AmpAcet Managing the Elements of Success, Technical Service Report, "What are Conductive Carbon Blacks? And how might I use them in my products?", 4 pages.

David B. Blackford et al., "Particle Size Analysis of Carbon Black", Part. Charact. 4 (1986) 112-117.

Huan Pang et al., "An electrically conducting polymer/graphene composite with a very low percolation threshold", Materials Letters, 2010, p. 1-4.

Kim et al. "Improved Thermoelectric Behavior of Nanotube-Filled Polymer Composites with Poly(3,4-ethylenedioxythiophene) Poly(styrenesulfonate)", American Chemical Society, vol. 4, No. 1 (2010) 513-523.

Parks, "Radiation Crosslinking of Polymers", Sterigenics Advanced Applications, Feb. 2, 2010, pp. 1-6.

Yu et al. "Thermoelectric Behavior of Segregated-Network Polymer Nanocomposites", Nano Letters, vol. 8, No. 12 (2008) 4428-4432.

* cited by examiner

US 10,497,849 B2

THERMOELECTRIC POLYMER COMPOSITE, METHOD OF MAKING AND USE OF SAME

CROSS REFERENCE TO RELATED APPLICATIONS

This application is a continuation of U.S. application Ser. No. 13/898,521 filed May 21, 2013, the disclosure of which is incorporated by reference herein in its entirety.

BACKGROUND

Various materials exhibit thermoelectric properties such as a Seebeck effect or Peltier effect. Certain semiconductors have been used as Peltier devices due to their efficiency in cooling. When used in a Peltier junction, a semiconductor element must be supplied with a voltage in order to actively cool its surrounding environment. Because of the physical rigidity of many semiconductors, such Peltier devices are also rigid. Moreover, the temperature range at which they operate may be limited to tens of degrees above room temperature. Similar concerns can limit Seebeck effect devices.

Therefore, more pliable and easily machined materials with higher thermal tolerances would prove beneficial. However, balancing electrical conductivity, thermal conductivity, and other material properties has proved to be difficult. New materials and methods for thermoelectric power generation and heat transfer are desired.

BRIEF DESCRIPTION

The above and other deficiencies of the prior art are overcome by, in an embodiment, a thermoelectric composite comprising: a plurality of particles comprising a crosslinked polymer having a heat deflection temperature greater than or equal to 200° F. (93° C.); and a segregated network comprising a first filler material which is disposed between the particles to produce a thermoelectric response in response to application of a voltage difference or temperature difference across the thermoelectric composite, the first filler material comprising a carbon material, a metal, a metal disposed on a carbon material, or a combination thereof.

In another embodiment, a process for preparing a thermoelectric article comprises: combining a first filler material and a plurality of particles comprising a polymer to form a composition; and molding the composition to form a thermoelectric article, wherein the first filler material comprises a carbon material, a metal, a metal disposed on a carbon material, or a combination thereof, and the thermoelectric article is configured to produce a thermoelectric response in response to application of a voltage difference or temperature difference across the article.

In a further embodiment, a process for using a thermoelectric article comprises: disposing the thermoelectric article in an environment; transferring heat between the thermoelectric article and the environment; and producing an electrical current through the thermoelectric article, or voltage across the thermoelectric article, or a combination thereof.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been found that a composite of a certain polymer and filler exhibits beneficial thermoelectric properties. The thermoelectric composite has a large range of values for its electrical conductivity and thermal conductivity. Moreover, the through-plane thermal conductivity of the thermoelectric composite is low enough while the electrical conductivity is large enough so that the composite is useful as an effective power generation device or cooling device. In addition, a synergistic effect of the polymer particles and filler enhances performance and properties of the thermoelectric composite such as Seebeck effect and Peltier effect. Articles made of the thermoelectric composite are rendered with enhanced cooling efficiency and power generation and are useful under high temperature conditions due to the resiliency of the polymer to thermal failure.

Figure 1:
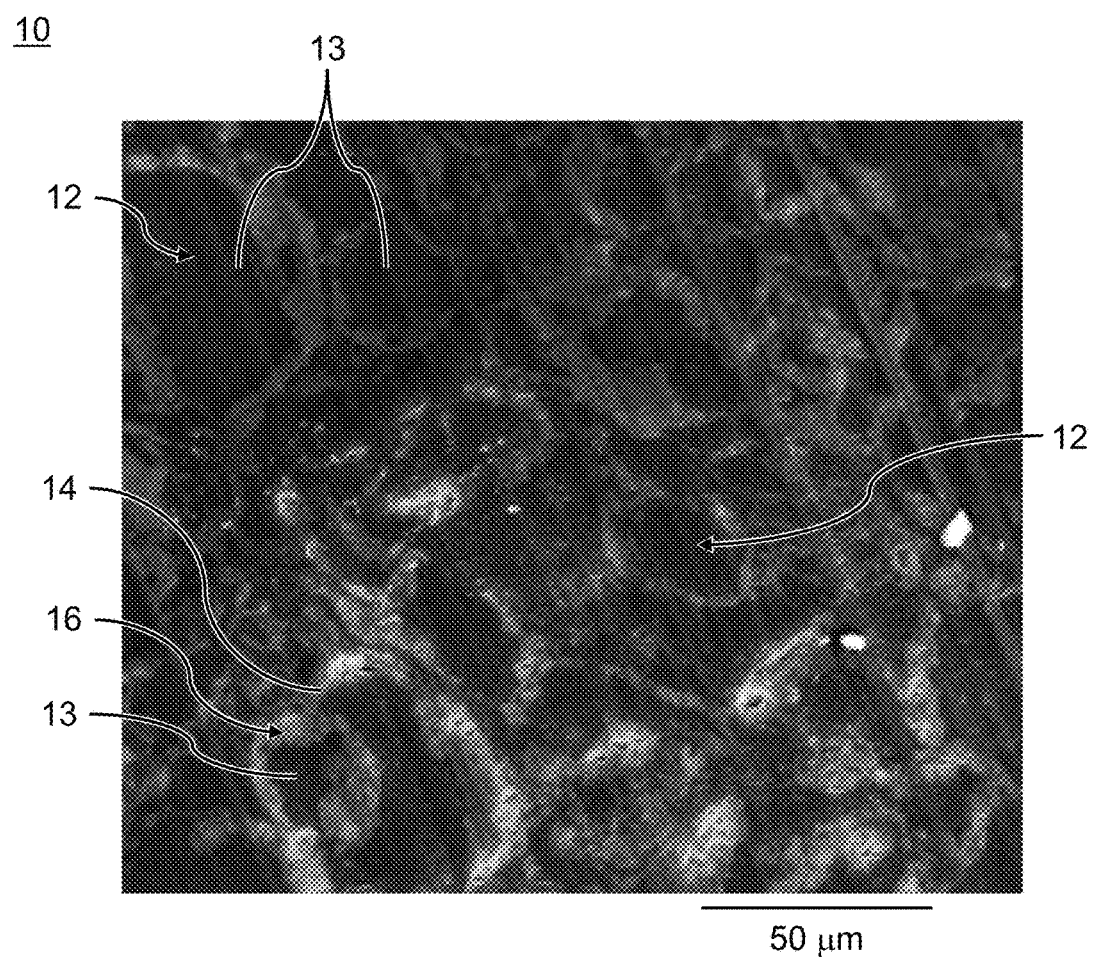
FIG. 1 shows a cross-section of a thermoelectric composite according to an embodiment described herein.

In an embodiment, a thermoelectric composite includes a plurality of particles and a first filler material disposed between the particles. The particles include a crosslinked polymer, and the first filler material is contained in a segregated network. The first filler material can include a carbon material, a metal, a metal disposed on a carbon material, or a combination thereof. Moreover, the segregated network is configured to produce a thermoelectric response in response to application of a voltage difference or temperature difference across the thermoelectric composite. Thus, as shown in FIG. 1, the thermoelectric composite 10 includes a plurality of particles 12 that includes a crosslinked polymer 13 and a segregated network 14, including a first filler material 16.

Polymers from which the thermoelectric composite is formed include conductive polymers. The conductive polymer can be thermally conductive, electrically conductive, or a combination thereof. Exemplary polymers can be an engineering thermoplastic, polyphenylene sulfide, polyphenylsulfone, self-reinforced polyphenylene, polyethersulfone, polyetherether ketone, polytetrafluoroethylene, polyaryletherketones, polyphenylene sulfone ureas, and the like. Exemplary polyarylsulfones that can be used include polyphenylsulfone that are available from sources such as Solvay Specialty Polymers, Quadrant EPP, Centroplast Centro, Duneon, GEHR Plastics, Westlake Plastics, and Gharda Chemicals. Commercial grades of polyphenylsulfones include those with the trade names Radel®, Udel®, Ultrason®, and Gafone®. An example of a polyarylsulfone includes those that are commercially available under the trade name Astrel® from 3M. Exemplary polyphenylene sulfides include those with either a branched structure, such as those marketed under the trade name Ryton® by Chevron-Phillips, a linear structure, such as those marketed under the trade name Fortron® by Ticona, or a combination thereof. Exemplary self-reinforced polyphenylenes that can be used include those that are commercially available under the trade name PrimoSpire® PR-250 from Solvay Advanced Polymers. Exemplary polyethersulfones include those that are commercially available under the trade name Victrex PES® from ICI.

In an embodiment, the polymer has a an electrical conductivity from $10^{-15}$ Siemens per meter (S/m) to $10^{-11}$ S/m, specifically $10^{-14}$ S/m to $10^{-11}$ S/m, and more specifically $10^{-14}$ S/m to $10^{-12}$ S/m. The polymer is a high temperature material that resists thermal degradation at temperatures where many polymers fail. In this regard, the melting temperature of the polymer is greater than 200° C., specifically 225° C., and more specifically 250° C. Additionally, the polymer can withstand contact with a chemical compound in a sour or sweet environment at a temperature greater than or equal to 200° C., specifically 210° C., and more specifically 225° C. Chemical compounds in a sweet or sour environment include, e.g., $H_2S$, $CO_2$, formic acid ($HCO_2H$), acetic acid ($CH_3CO_2H$), other short carbon chain acids, and the like. Moreover, the polymer has a heat deflection temperature and dimensional stability at a temperature greater than or equal to 90° C., specifically 150° C., and more specifically 200° C., as determined by a test procedure described in ASTM standard D648. In an embodiment, the polymer is non-hygroscopic.

According to an embodiment, the polymer in the individual particles is crosslinked. Accordingly, there is provided, in an embodiment, a thermoelectric composite that includes particles that include a crosslinked product of an aforementioned polymer or a combination thereof. Exemplary crosslinked products include crosslinked polyarylenes, crosslinked polyaryl sulfides, crosslinked polyaryl sulfones, and crosslinked polysulfones. In a particular embodiment, the crosslinked product is crosslinked polyphenylene sulfide (x-PPS), crosslinked polyphenylsulfone (x-PPSU), crosslinked self-reinforced polyphenylene (x-SRP), crosslinked polyethersulfone (x-PESU), or a combination thereof. Consequently, in one embodiment, the crosslinked product includes a crosslink between, for example, x-PPS, x-PPSU, x-SRP, x-PESU, or a combination thereof. Descriptions of x-PPS, x-PPSU, and x-SRP and processes for making each are described in U.S. patent application Ser. Nos. 13/179,230, 13/229,923, 13/246,250, 13/303,688, and 13/343,264, the disclosure of each of which application is incorporated herein in its entirety.

The crosslinked product can be prepared by oxidative crosslinking a polymer in the presence of a molecular crosslinking agent. In an embodiment, the molecular crosslinking agent can be oxygen (pure or from a mixture of gases including oxygen, e.g., air with or without an inert gas such as nitrogen, helium, argon, carbon dioxide), an inorganic oxidant (e.g., magnesium oxide), organic oxidant (e.g., dicumyl peroxide), or the like. In an embodiment, crosslinking is carried out in air. Ambient pressure or elevated pressure (>1 atmosphere) can be used, or a partial pressure lower than ambient can be used. Crosslinking of the base polymer can be carried out at a temperature of about 200° C. to about 400° C., in another embodiment about 250° C. to about 390° C., and in another embodiment about 300° C. to about 380° C. The curing time is for a total time of less than or equal to 200 hours, specifically less than 75 hours. In an embodiment, certain crosslinked polymers such as x-SRP is not soluble in solvents such as N-methyl-2-pyrrolidone (NMP) or N,N-dimethylformamide (DMF), which can be used to confirm that molecular crosslinking occurred. The crosslinked product also shows a rubber-like plateau having relatively high modulus at a temperature above its Tg. In an embodiment, the Tg of crosslinked polyphenylene increases from 120° C. for the polymer (polyphenylene) to 180° C. for the crosslinked polyphenylene, as determined using dynamic mechanical analysis (DMA), which can be used to determine the elastic and storage moduli of the crosslinked polymer. In an embodiment, the particles of the polymer are subjected to crosslinking so that the individual particles contain the crosslinked polymer. In another embodiment, a bulk polymer (instead of particles) is subjected to crosslinking followed by comminuting the resulting bulk of crosslinked polymer into particles containing the crosslinked polymer. Comminuting can include grinding, calendaring, milling, extrusion, and the like. The size distribution of the particles can be unimodal or multimodal or can be monodisperse or polydisperse. As used herein, size of a particle refers to a largest linear dimension (sometimes referred to as a diameter) of the particle. The size of the particles can be from 1 micrometer (μm) to 250 μm, specifically 50 μm to 200 μm, and more specifically 50 μm to 200 μm. The average particle size can be from 100 μm to 200 μm, and specifically 100 μm to 150 μm.

The degree of crosslinking in the individual particles is an amount effective such the plurality of particles that contain the crosslinked polymer withstand the amount of shear generated during processing (e.g., compression molding) of the composition containing the particles and first filler material to form the thermoelectric composite herein. In this manner, although the shape of a particle can be changed during process, the particle remains intact without deteriorating, decomposing, being shredded, or falling apart. It is contemplated that the degree of crosslinking of the polymer can change the crystallinity of the particles and can affect their conductivity. In an embodiment, the degree of crosslinking is selected to achieve a value of the electrical conductivity or the thermal conductivity of the thermoelectric composite. The polymer in the particle can be fully crosslinked, partially crosslinked (including heavily or lightly crosslinked, based on the degree of crosslinking), or a combination thereof. Combinations of particles that contain fully crosslinked polymer can be included with particles that contain partially crosslinked polymer.

According to an embodiment, the thermoelectric composite can contain an additional polymer. The additional polymer can be disposed in second particles that are combined with the plurality of particles of the polymer described above or can be present in the plurality of the particles (such that particles contain more than one polymer, i.e., the polymer above and the additional polymer). In a further embodiment, the polymers can be crosslinked alone or in the presence of an additional polymer in order to obtain the desired mechanical or chemical properties of the thermoelectric composite. In an embodiment, no additional polymer is present during crosslinking the polymer to form the crosslinked product. If used, in order to maintain the desired properties of the thermoelectric composite containing the polymer or crosslinked product, an amount of the additional polymer can be limited, being present for example in amount of 0.01 to 20 weight percent (wt %), 0.1 to 10 wt %, or 1 to 5 wt % of the total weight of the polymer, crosslinked polymer, or combination thereof. For example, if used, an aromatic thermoplastic polymer can be present, such as aromatic polyamides, polyimides, polyetherimides, polyaryletherketones (PAEK), or the like, or combinations comprising at least one of the foregoing. Additional polymers containing oxygen include, for example, acetal resins (e.g., polyoxymethylene (POM)), polyester resins (e.g., poly(ethylene terephthalate) (PET), poly(butylene terephthalate) (PBT), and poly(ethylene naphthalate) (PEN)), polyarylates (PAR), poly(phenylene ether) (PPE), polycarbonate (PC), aliphatic polyketones (e.g., polyketone (PK)), poly(ether ketones) (polyetherketone (PEK), polyetherketoneketone (PEKK), and polyetherketone etherketone ketone (PEKEKK)), and acrylic resins (e.g., polymethylmethacrylate (PMMA)) can be used. The additional polymer can be linear or branched, homopolymers or copolymers, and used alone or in combination with one or more other aromatic thermoplastic polymers. Copolymers include random, alternating, graft, and block copolymers, the block copolymers having two or more blocks of different homopolymers, random copolymers, or alternating copolymers. The thermoplastic polymers can further be chemically modified to include, for example, functional groups such as halogen, alcohol, ether, ester, amide, etc. groups, or can be oxidized, hydrogenated, and the like. A reactive elastomer or fluoropolymer can be blended with the polymer or crosslinked product (before crosslinking to form the crosslinked polymer) and grafted thereto to increase flexibility of the thermoelectric composite. Examples of reactive elastomers or fluoropolymers include polytetrafluoroethylene (PTFE), nitrile-butyl rubber (NBR), hydrogenated nitrile-butyl rubber (HNBR), high fluorine content fluoroelastomers rubbers such as those in the FKM family and marketed under the tradename VITON® fluoroelastomers (available from FKM-Industries) and perfluoroelastomers such as FFKM (also available from FKM-Industries) and marketed under the tradename KALREZ® perfluoroelastomers (available from DuPont), and VECTOR® adhesives (available from Dexco LP), organopolysiloxanes such as functionalized or unfunctionalized polydimethylsiloxanes (PDMS), tetrafluoroethylene-propylene elastomeric copolymers such as those marketed under the tradename AFLAS® and marketed by Asahi Glass Co., ethylene-propylene-diene monomer (EPDM) rubbers, polyvinylalcohol (PVA), and the like, and combinations comprising at least one of the foregoing polymers.

In an embodiment, the particles include a second filler material. The second filler material is dispersed among the polymer in individual particles of the plurality of particles. In this manner, the particles include the polymer and the second filler material. Some or all of the particles can include the second filler material. The second filler material can be the same or different as the first filler material in the thermoelectric composite. The additional polymer or second filler material can be included in the particle before or after crosslinking the polymer.

The first filler material and the second filler material of the thermoelectric composite can independently include a carbon material, a metal, a metal disposed on a carbon material, or a combination thereof. As used herein, filler material refers to the first filler material or the second filler material. Exemplary carbon material includes carbon fiber, carbon nanotubes, carbon black, acetylene black, activated carbon, graphite, graphene, or a combination thereof. The carbon nanotubes can be single walled nanotubes (SWNTs) or multi-walled nanotubes (MWNTs). In an embodiment, the filler material is an electrically conductive carbon black. The carbon black can have a volume resistivity less than or equal to 10 ohm-cm (Ωcm), specifically 0.5 Ωcm to 10 Ωcm, and more specifically 2 Ωcm to 9 Ωcm. The conductive carbon black can be a carbon black having a volume resistivity of 9 Ωcm commercially available from, e.g., Timcal or Akzo Nobel.

Carbon material, from which the filler material is formed, has an average size, in at least one dimension, of greater than one micrometer (μm). As used herein "average particle size" refers to the number average particle size based on the largest linear dimension of the particle (sometimes referred to as "diameter"). Particle size, including average, maximum, and minimum particle sizes, may be determined by an appropriate method of sizing particles such as, for example, static or dynamic light scattering (SLS or DLS) using a laser light source. In an embodiment, the carbon material can have an average particle size of 1 μm to 1 mm, more specifically 1 μm to 500 μm, and still more specifically 1 μm to 75 μm. The carbon material can be monodisperse, where all particles are of the same size with little variation, or polydisperse, where the particles have a range of sizes. Generally, polydisperse carbon material is used. Carbon material of different average particle size can be used, and in this way, the particle size distribution of the carbon material may be unimodal (exhibiting a single size distribution), bimodal exhibiting two size distributions, or multi-modal, exhibiting more than one particle size distribution. In an embodiment, the carbon material has a length dimension that is much greater than its diameter, as with carbon nanotubes. Furthermore, the carbon material can be used as received from a commercial source or can be processed after receipt. In an embodiment, the carbon material as-received is processed by decreasing the length of a size, for example, a length of carbon nanotubes.

The carbon material can have a density for example, but not limited to, from 1.0 gram per cubic centimeter (g/cm$^3$) to 2.5 g/cm$^3$, specifically 1.0 g/cm$^3$ to 2.2 g/cm$^3$, and more specifically from 1.0 g/cm$^3$ to 2.0 g/cm$^3$. The surface area of the carbon material is high and can be greater than 300 m$^2$/g and in a specific embodiment 300 m$^2$/g to 1800 m$^2$/g, and more specifically 500 m$^2$/g to 1500 m$^2$/g.

In an embodiment, the carbon material is a graphene including nanographene and graphene fibers (i.e., graphene particles having an average largest dimension of greater than 1 mm and an aspect ratio of greater than 10, where the graphene particles form an interbonded chain). Graphene and nanographene are effectively two-dimensional particles of nominal thickness, having of one or more layers of fused hexagonal rings with an extended delocalized π-electron system layered and weakly bonded to one another through π-π stacking interaction. Graphene in general, including nanographene, can be a single sheet or a stack of several sheets having both micro- and nano-scale dimensions, such as in some embodiments an average particle size of 1 to 20 µm, specifically 1 to 15 µm, and an average thickness (smallest) dimension in nano-scale dimensions of less than or equal to 50 nm, specifically less than or equal to 25 nm, and more specifically less than or equal to 10 nm. An exemplary nanographene can have an average particle size of 1 to 5 µm, and specifically 2 to 4 µm. In addition, smaller nanoparticles or sub-micron sized particles may be combined with the carbon material having an average particle size of greater than or equal to 1 µm. In a specific embodiment, the carbon material is a carbon fiber.

Graphene can be prepared by exfoliation of graphite or by a synthetic procedure by "unzipping" a nanotube to form a nanographene ribbon, followed by derivatization of the nanographene to prepare, for example, graphene oxide.

Exfoliation to form graphene or nanographene can be carried out by exfoliation of a graphite source such as graphite, intercalated graphite, and nanographite. Exemplary exfoliation methods include, but are not limited to, fluorination, acid intercalation, acid intercalation followed by thermal shock treatment, and the like, or a combination comprising at least one of the foregoing. Exfoliation of the nanographite provides a nanographene having fewer layers than non-exfoliated nanographite. It will be appreciated that exfoliation of nanographite can provide the nanographene as a single sheet only one molecule thick, or as a layered stack of relatively few sheets. In an embodiment, exfoliated nanographene has fewer than 50 single sheet layers, specifically fewer than 20 single sheet layers, specifically fewer than 10 single sheet layers, and more specifically fewer than 5 single sheet layers.

In an embodiment, the carbon material can be derivatized to include functional groups such as, for example, epoxy, ether, ketone, alkaryl, lactone, alkyl, alkoxy, haloakyl, cycloalkyl, heterocycloalkyl, cycloalkyloxy, aryl, aralkyl, aryloxy, aralkyloxy, heteroaryl, heteroaralkyl, alkenyl, alkynyl, amine, alkyleneamine, aryleneamine, alkenyleneamine, hydroxy, carboxy (e.g., a carboxylic acid group or salt), halogen, hydrogen, or a combination thereof. The functional group can also include a polymeric or oligomeric group bonded to the first or second nanoparticle. Exemplary polymeric or oligomeric groups are polyethers, polyols, polyalkanes, polysulfone, cellulose, polyalkyne, polyvinyl, acrylic, polyamide, polyamine, polyheteroaromatic, polydiene, polyolefin, polyester, polyketone, or a hydrocarbon or siloxane chain (branched or straight chain) that contains a functional group such as, for example, epoxy, ether, ketone, alkaryl, lactone, alkyl, alkoxy, haloakyl, cycloalkyl, heterocycloalkyl, cycloalkyloxy, aryl, aralkyl, aryloxy, aralkyloxy, heteroaryl, heteroaralkyl, alkenyl, alkynyl, amine, alkyleneamine, aryleneamine, alkenyleneamine, hydroxy, carboxy (e.g., a carboxylic acid group or salt), halogen, hydrogen, or a combination thereof. The carbon material can be derivatized to introduce chemical functionality to the carbon material. For example, for carbon nanotubes, the peripheral surface sites and/or edges of the nanotube is derivatized to increase dispersibility in and interaction with the polymer or bonding with the metal disposed thereon. In an embodiment, the derivatized carbon material can be hydrophilic, hydrophobic, oxophilic, lipophilic, oleophobic, oleophilic, or may possess a combination of these properties to provide a balance of desirable net properties, by use of different functional groups.

Besides the polymer, the filler material includes a metal disposed, for example deposited, on the carbon material. The metal can be disposed on the carbon material by a chemical interaction, physical interaction, or a combination thereof. The metal can be physisorbed or chemisorbed on a portion of or a complete surface of the carbon material. Further, the metal can be bonded to the carbon material by an ionic bond, covalent bond, dative bond, hydrogen bond, coordinate bond, or a combination thereof.

Figure 13:
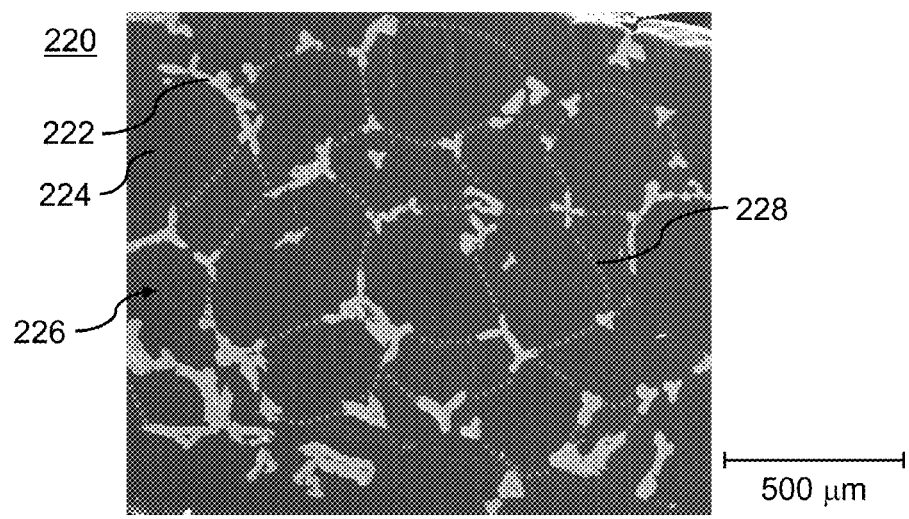
FIG. 13 shows an electron microscope micrograph of a cross-section of a thermoelectric composite including Ni foam and polyphenylene sulfide (PPS).

According to an embodiment, the filler material is a metal. Here, the metal is not disposed on the carbon material. Although in some embodiments, the filler material can contain a metal and a carbon material, the metal can contact the carbon material without actually being disposed on the carbon material. Disposal of the metal on the carbon material can include, e.g., physical or chemical attachment to the carbon material such as by physisorption and chemisorption, including weak or strong electrostatic interaction or bonding of various sorts (e.g., ionic bonding, dative bonding, hydrogen bonding, back bonding, ligand bonding, and the like). With respect to the carbon material, the metal can be disposed on a surface, interior, or exterior or in a pore, and the like, or a combination thereof. In an embodiment, the metal is a foam, solid, coiled metal pieces, metal turnings, flakes, chips, or a combination thereof. According to an embodiment, the metal is a metal foam that has a network of metal and open pores. In an embodiment, the thermoelectric composite is formed such that the polymer is disposed in the pores of the metal foam as in FIG. 13.

Exemplary metals include cadmium, chromium, cobalt, copper, brass, iridium, iron, lead, molybdenum, nickel, platinum, ruthenium, steel, selenium, tin, titanium, tungsten, vanadium, zinc, an alloy thereof, or a combination thereof. Moreover, the metal disposed on the carbon material can be present in an amount effective such that the thermoelectric composite has a Seebeck effect or Peltier effect that respectively allows efficient power generation or cooling of an article made of the thermoelectric composite. In an embodiment, the metal has a conductivity from $3 \times 10^7$ Siemens per meter (S/m) or less, specifically $3 \times 10^7$ S/m to $5 \times 10^5$, and more specifically $2 \times 10^7$ to $2 \times 10^6$ S/m.

Metals disposed on carbon material are commercially available. Alternatively, a metal disposed on carbon material can be made from the carbon material and metal raw materials. In one embodiment, nickel disposed on carbon fiber can be prepared by activating the carbon fiber in a solution of butadiene palladium chloride, drying, and then nickel coating in a metallization bath at a basic pH containing nickel chloride hexahydrate, citric acid, and dimethyl aminoborane.

In an embodiment, the thermoelectric composite also includes an additive. Additive, as used herein, includes a reinforcing or non-reinforcing additive. Reinforcing additives include, for example, silica, glass fiber, and the like, which can be added to the thermoelectric composite to increase strength. Non-reinforcing additives such as polytetrafluoroethylene (PTFE), molybdenum disulfide ($MoS_2$), and the like can be added to the thermoelectric composite to increase lubrication. Other additives, such as inorganic nanoparticles, nanoclays, or the like, can be incorporated into the thermoelectric composite to increase the strength and elongation of the material. The additives can further be functionalized to include grafts or functional groups to adjust properties such as solubility, surface charge, hydrophilicity, lipophilicity, and other properties. Combinations comprising at least one of the foregoing additives can be used. The additive can be present in the thermoelectric composite in an amount from 0.5 wt. % to 35 wt. %, specifically 0.5 wt. % to 20 wt. %, and more specifically 0.5 wt % to 15 wt %, based on the weight of the thermoelectric composite.

The filler material (the first filler material or second filler material) can be present in the thermoelectric composite in an amount from 1 wt % to 70 wt %, specifically 5 wt % to 70 wt %, and more specifically 5 wt % to 60 wt %, based on a weight of the polymer in the thermoelectric composite. The metal disposed on the carbon material can be present in an amount from 0.5 wt. % to 70 wt. %, 0.5 wt. % to 50 wt. %, and more specifically 0.5 wt. % to 30 wt. %, based on the weight of the carbon material.

Figure 2:
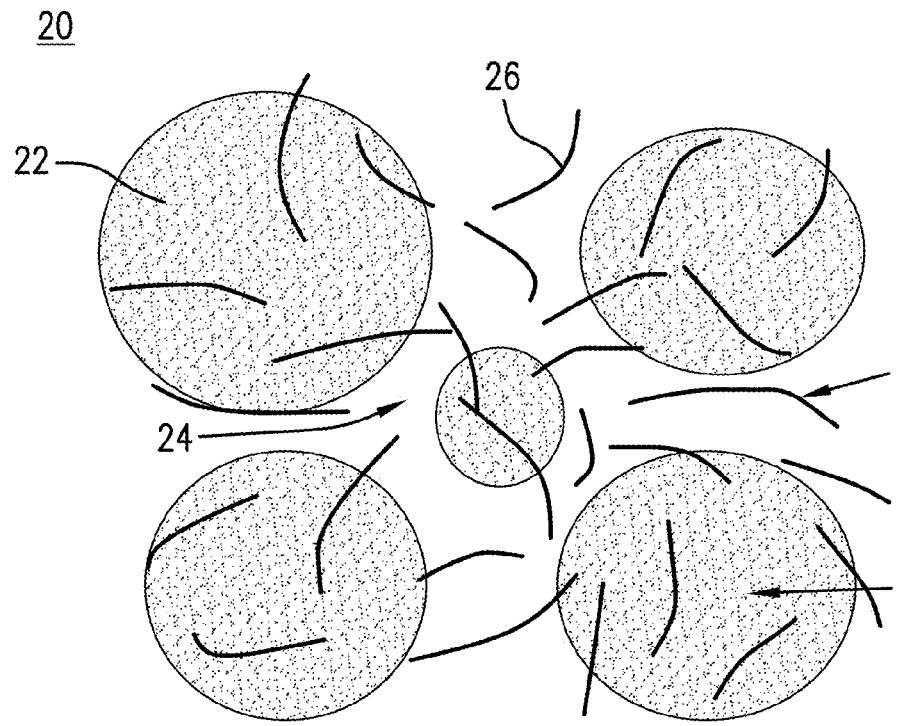
FIG. 2 shows a top view of a composition including polymer particles and filler material.

The thermoelectric composite can be prepared by combining a polymer and a first filler material to form a composition. Such combining includes, for example, blending, mixing, milling, and the like using such devices as a blender, acoustic mixer, mill, and the like. During combining, the degree of dispersing the first filler material among the plurality of particles can be controlled such that a high degree, low degree, or moderate degree of homogenization of the first filler material among the particles in the composition is achieved. As shown in FIG. 2, the composition 20 thus includes particles 22 arranged such that an interparticle space 24 separates neighboring particles 22. Due to combining, the first filler material 26 can be uniformly dispersed among the particles 22 in the interparticle space 24. Depending on the size and number density of the first filler material 26, the particles can be coated with the first filler material 26. It is contemplated that the mixing time of the first filler material 26 with the particles 22 affects the ultimate electrical conductivity of the composition and an article thereof and can contribute to the electrical resistance of the composition and article.

According to an embodiment, the particles are formed to include a polymer and a second filler material before combining the particles with the first filler material. Here, the second filler material is dispersed in the polymer with subsequent formation of the particles to include the second filler material and the polymer. In an embodiment, the second filler material can be introduced to a powder of the polymer, subjected to dispersion therein, and formed into the particles. The particles of the second filler material and the polymer can be formed by extrusion, milling, and the like. The second filler material can be present in an amount from 1 wt % to 70 wt %, specifically 5 wt % to 70 wt %, and more specifically 5 wt % to 60 wt %, based on a weight of particles. Hereafter, reference to the particles includes a particle including the second material, without the second material, or a combination thereof.

The particles can be ground and sieved to obtain a known or selected size distribution. Similarly, the first filler material can be selected for a particular size. In an embodiment, a 100 to 140 mesh sieve can be used to sieve the particles, the particles passing through the sieve being used in combination with the first filler material. To provide mechanical stability to the particles and to obtain certain physical and chemical properties, the particles can be subjected to thermal processing to crosslink the polymer in the individual particles. In an embodiment, the particles are heated to a temperature effective for crosslinking, e.g., greater than 200° C., specifically 230° C., and more specifically 260° C. for a time, e.g., from 10 hours to 80 hours, specifically 40 hours to 70 hours, and more specifically 50 hours to 60 hours. Crosslinking can occur prior to addition of the first filler material or other processing, e.g., melt molding.

The particles can be can be comminuted, e.g., by grinding or milling to produce particles having a selected particle size. In an embodiment, particles that include the second filler material can be ground and sieved prior to thermally treating the particle to crosslink the particle. The resulting particles can be combined, e.g., dry blended using an acoustic mixer, with the first filler material to form the composition. The first filler material can be present in an amount from 1 wt. % to 70 wt. %, specifically 5 wt % to 70 wt %, and more specifically 5 wt % to 60 wt %, based on a weight of the polymer in the thermoelectric composite. Moreover, because the particles can include a second filler material, the total amount of filler material (inclusive of the first and second filler materials) in the composition can be from 1 wt. % to 80 wt. %, specifically 5 wt % to 70 wt %, and more specifically 5 wt % to 60 wt %, based on the weight of the composition. In a particular embodiment, the filler is present from 1 wt % to 20 wt %, based on the weight of the composition. The composition can be heated, e.g., in a mold to decrease or eliminate moisture. The temperature can be, e.g., 150° C. for a time of several hours to a day. In an embodiment, the temperature of the composition is increased to soften the particles under a compressive force. Here, the particles can be heated from 250° C. to 375° C., specifically 275° C. to 350° C., and more specifically 300° C. to 350° C. for a time effective to soften the particles, e.g., from 1 hour to 8 hours, specifically 2 hours to 6 hours, and more specifically 3 hours to 5 hours. The pressure can be from 1000 pounds per square inch (psi) to 2000 psi, and specifically 1200 psi to 1700 psi for a time effective to compress the composition into the thermoelectric composite. In addition to compression molding, the composition can also be injection molded, blow molded and the like. The thermoelectric composite is cooled and de-molded and has a Seebeck effect or Peltier effect. The de-molded thermoelectric composite can be used as a thermoelectric article or further worked to produce a thermoelectric article. In an embodiment, the molded article can be machined further to a desired size or shape. Machining can include cutting, drilling, lathing, milling, coating, and the like.

Figure 3:
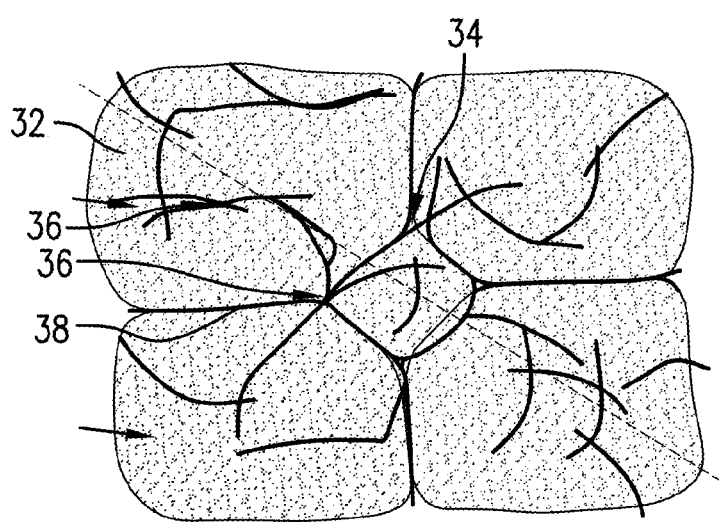
FIG. 3 shows a top view of a thermoelectric composite including polymer particles and a segregated network that includes filler material.

As shown in FIG. 3, the thermoelectric composite 30 includes a plurality of particles 32 with an interparticle space 34 in which a segregated network 36 of first filler material 38 is disposed. The segregated network 36 is nonuniformly distributed among the particles 32.

Therefore, according to an embodiment, a process for preparing a thermoelectric article includes combining a filler material and a plurality of particles including a polymer to form a composition, and the composition is molded to form an article. The filler material includes a carbon material, a metal, a metal disposed on a carbon material, or a combination thereof, and the article is configured to produce a thermoelectric response in response to application of a voltage difference or temperature difference across the article. In an embodiment, the method further includes heating the plurality of particles including the polymer to crosslink the polymer in the individual particles. According to an embodiment, the molding the composition includes applying pressure to the composition and heating the composition to crosslink the polymer and to form a crosslinked polymer, wherein the polymer is disposed in the metal in response to applying the pressure. In some embodiments, the metal is a foam having open pores, and the polymer is disposed in pores of the metal foam during compression of the metal foam and the polymer. In one embodiment, the polymer particles are lightly crosslinked before being combined with the filler material followed by molding to form the article. Without wishing to be bound by theory, it is believed that lightly crosslinking the polymer increases the viscosity of the polymer so that the filler material provides thermoelectric properties to the article after molding.

The article has thermoelectric properties such as a Seebeck effect or Peltier effect. In an embodiment, the article can be contacted with a terminal. The article with the terminal is configured to transmit electrical current, apply voltage across a portion of the article, or a combination thereof. The terminal can be an electrical contact point for transmission of the electrical current, application of voltage across a portion of the article, or a combination thereof. In an embodiment the terminal is metal, e.g., a previously disclosed metal that is disposed on the carbon material of the filler, another metal (e.g., copper, gold, silver, and the like), or a combination thereof. The terminal can be in a solid metallic state, or can be, e.g., a conductive paste. According to an embodiment, the terminal is disposed on a position on a surface of the article, in the interior of the article, or a combination thereof. Moreover, a plurality of terminals can be arranged on or in the article. In the case of a terminal being arranged inside the article, a portion of the terminal can extend to the outer surface of the article in order for electrical contact with an external conductor to be made.

In a particular embodiment, the article is made as described above, and the article includes a first terminal disposed at first position of the article and a second terminal disposed at a second position of the article. The article can be configured to flow an electrical current through the first terminal, second terminal, and the article between the first and second positions. In this manner, the electrical current can be produced by a temperature difference between the first position and the second position. Such a condition allows the article to produce power production via a Seebeck effect. Alternatively, the article can be configured to transfer heat away from an area proximate to the article, in response to a voltage applied across the first terminal and the second terminal due to its Peltier effect.

Figure 4:
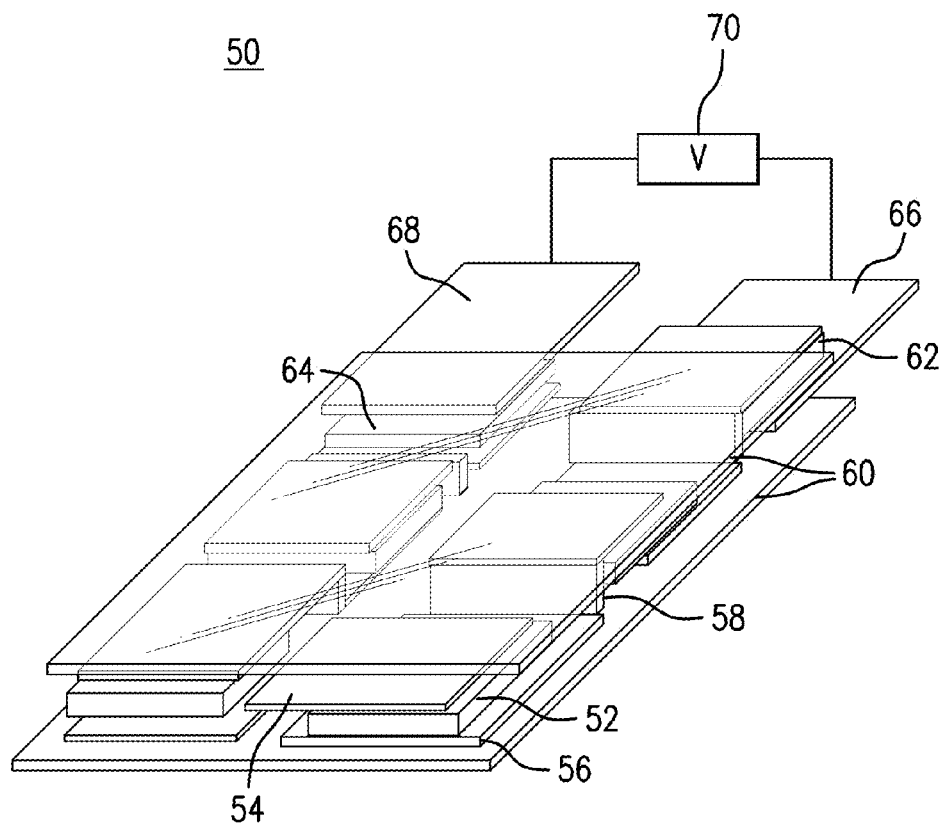
FIG. 4 shows a perspective view of a thermoelectric article according to an embodiment disclosed herein.

According to an embodiment, a thermoelectric article includes a plurality of thermoelectric composites that are electrically connected. The electrical connections among the thermoelectric composites can be serial connections. FIG. 4 is a perspective view of the thermoelectric article 50 that includes a plurality of thermoelectric composites 52. An upper conductor 54 is disposed on an upper surface of the thermoelectric composite 52, and a lower conductor 56 is disposed on a lower surface of the thermoelectric composite 52. A middle connector 58 electrically connects the upper conductor 54 and the lower conductor 56. The upper conductor 54, lower conductor 56, and middle connector 58 are electrically conductive and can be a continual piece of conductor that is bent to cover the upper surface, lower surface, and side of the thermoelectric composite 52 that they contact. A cover layer 60 is disposed on the upper conductor 54, and a cover 60 is on a surface of the lower conductor 56 opposing the lower surface of the thermoelectric composite 52. The cover 60 is made of an electrically insulating material such as a glass, ceramic, or polymer. The cover 60 can be a single layer or more than one layer of a same or different material. In the thermoelectric article 50, a first electrode 66 contacts a first thermoelectric composite 62, and a second electrode 68 contact a last thermoelectric composite 64. A power source 70 can be connected between the first electrode 66 and the second electrode 68. The power source 70 can be an alternating current (AC) or direct current (DC) power source and can deliver continuous, pulsed, or switched power to the first electrode 66 and the second electrode 68.

Figure 5:
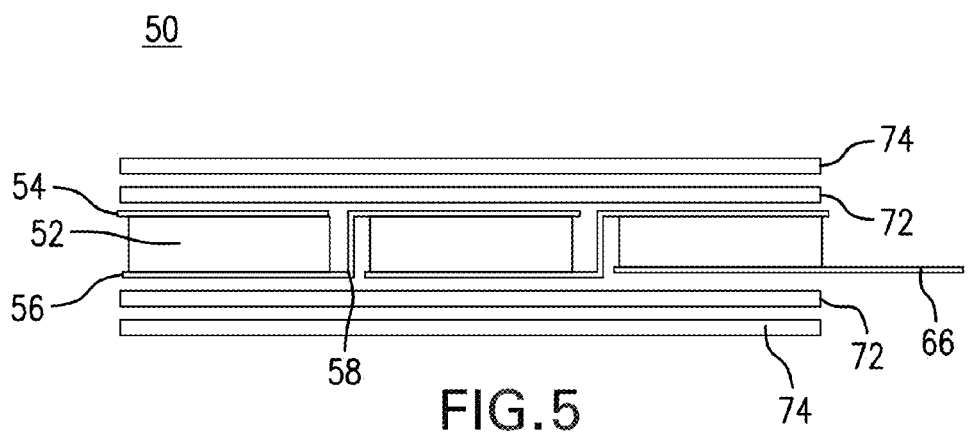
FIG. 5 shows a side view of the thermoelectric article of FIG. 4.

FIG. 5 shows a side view of the thermoelectric article shown in FIG. 4. Here, the cover layer 60 can include a single layer or multiple layers of material. In an embodiment, the cover layer 60 includes a first insulator layer 72 disposed on the upper electrode 54 and a second insulator layer 74 disposed on the first insulator layer 72. The first insulator layer 72 and the second insulator layer 74 can be made of a same or different material from one another. The first insulator layer 72 and the second insulator layer 74 can be attached together with a fastener, adhesive, bond, or electrostatic interaction. Although two layers are shown, it should be appreciated that more than two layers can be used. According to an embodiment, the first insulator layer 72 is electrically insulating but is thermally conductive, and the second insulator layer 74 is electrically and thermally conductive. The cover layer 60 can thus provide structural rigidity or allow structural flexibility to the thermoelectric article 50. It is envisioned that some portion or all of the thermoelectric article 50 can bend or can be rigid. In a particular embodiment, the first insulator layer 72 is a ceramic, and the second insulator layer 74 is a thermally conductive polymer, e.g., polyphenylene sulfide or filled polyphenylene sulfide (such as polyphenylene sulfide combined with copper).

Figure 6:
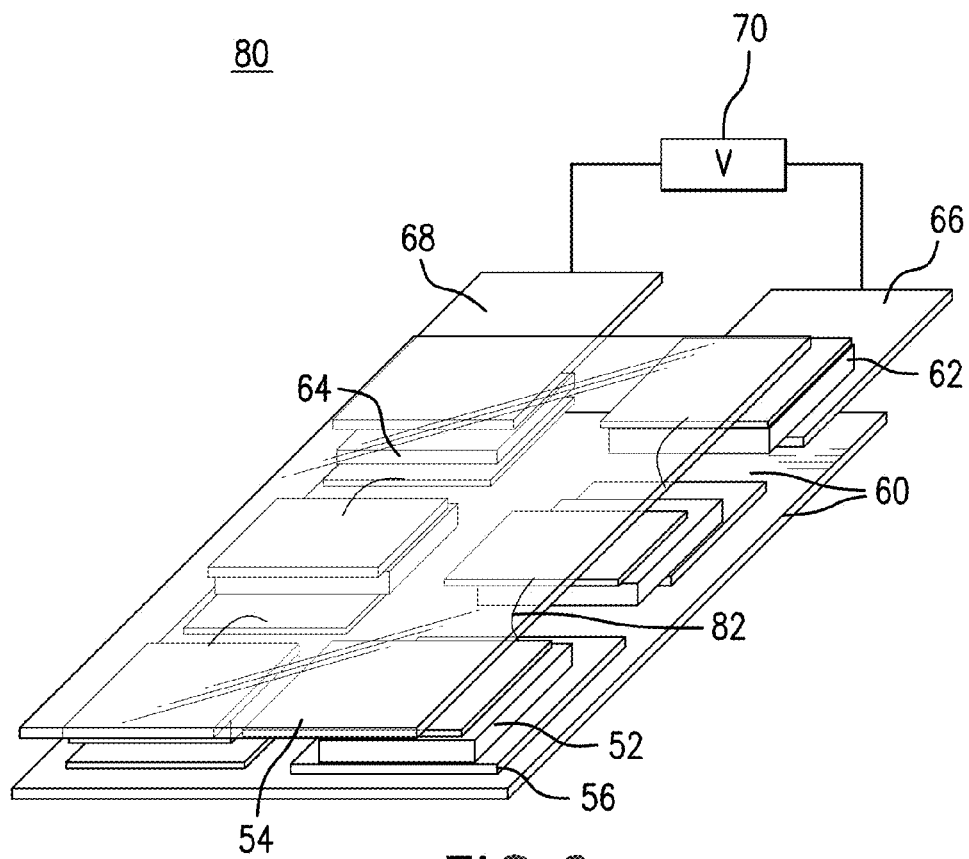
FIG. 6 shows a perspective view of a thermoelectric article according to an embodiment disclosed herein.
Figure 7:
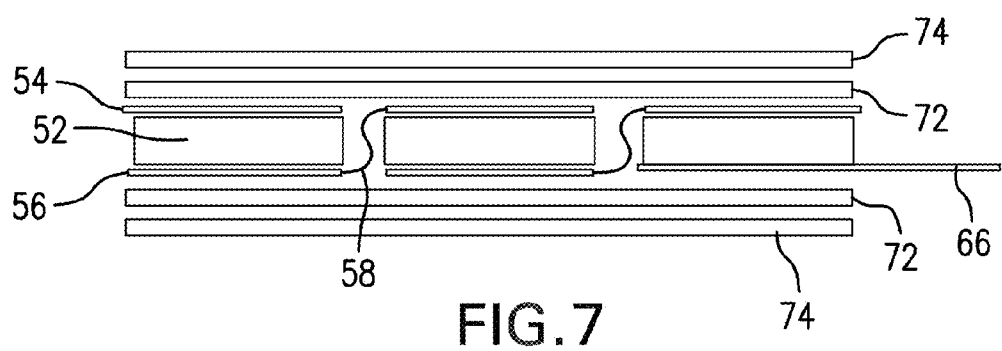
FIG. 7 shows a side view of the thermoelectric article of FIG. 6.

FIGS. 6 and 7 are similar to FIGS. 4 and 5 except that the middle conductor 82 has a smaller transverse cross-sectional area than the upper conductor 54 and the lower conductor 56. The middle conductor (58 or 82) can be connected to the upper conductor 54 or the lower conductor 56 by spot welding, soldering, pasting (using an electrically conductive paste), fastening (using a fastener, e.g., screw, crimp, clamp, and the like), fusing them together, and the like.

Although FIGS. 4 and 6 show six thermoelectric composites 52 connected in series, any number of thermoelectric composites 52 can be used to maximize the efficiency of the thermoelectric article 50 or to achieve a selected power generation level or cooling capacity. Additionally, in an embodiment, with respect to the cover layer 60, the first insulator layer 72 can include a ceramic, e.g., alumina, and the conductor (54, 56, 58, or 82) could be a metal, e.g., copper, aluminum, tin, and the like. In an embodiment, the cover layer 60 can include a polymers, e.g., a thermally conductive but electrically insulating polymer (e.g., a polymer composite having a boron nitride filler material) in place of the ceramic, and the conductor (54, 56, 58, or 82) can be a highly electrically conductive polymer or composite, e.g., PPS having copper disposed therein or thereon.

The thermoelectric composite and article made thereof have beneficial properties. In an embodiment, the thermoelectric composite has a thermal decomposition temperature greater than 200° C., specifically greater than 300° C., and more specifically greater than 350° C. The thermoelectric composite has an electrical conductivity from $10^2$ S/m to $10^5$ S/m, specifically $10^2$ S/m to $10^4$ S/m, and more specifically $10^3$ S/m to $10^4$ S/m. The thermal conductivity of the thermoelectric composite is from 0.2 Watts per meter per Kelvin (W/m·K) to 2.5 W/m·K, 0.3 to 1.5 W/m·K, and more specifically 0.3 to 1 W/m·K.

The thermoelectric composite has a Seebeck coefficient from 10 microvolts per Kelvin (μV/K) to 60 μV/K, and specifically 25 μV/K to 55 μV/K. Thus, the article exhibits a high capacity for power generation by sourcing current as result of a temperature difference applied across the article. Moreover, multiple thermoelectric composite pieces can be combined, e.g., electrically in series, in an article. In this manner, the total Seebeck coefficient of the article is the sum of the Seebeck coefficients of the individual thermoelectric composite pieces.

In addition, the thermoelectric composite has a cooling efficiency from 1 degree Celsius per amp (° C./A) to 40°

C./A, specifically 1° C./A to 35° C./A, and more specifically 1° C./A to 30° C./A. That is application of an amount of current through the article will result in a temperature differential across the article, cooling (i.e., dissipating) heat from an environment proximate to the article). Therefore, the article made of the thermoelectric composite has an advantageous efficiency for heat transfer from its surrounding. Moreover, upon applying a voltage across the article, a large amount of heat can be dissipated by the article from the area proximate to the article because of the Peltier effect exhibited by the article in response to the applied voltage.

The thermoelectric composite and article thereof also have enhanced mechanical properties. The tensile strength of the thermoelectric composite is 150 megapascals (MPa) or greater, specifically 175 MPa or greater, and more specifically 200 MPa or greater. The tensile modulus is 15 kilopascals (kPa) or greater, specifically 20 kPa or greater, and more specifically 25 kPa or greater. The glass transition temperature is 50° C. or greater, specifically 75° C. or greater, and more specifically 100° C. or greater. The melting temperature is 250° C. or greater, specifically 300° C. or greater, and more specifically 350° C. or greater. In addition, flexural strength is 150 MPa or greater, specifically 200 MPa or greater, and more specifically 250 MPa or greater. Further, the flexural modulus is 10 kilomegapascals (kMPa) or greater, specifically 15 kMPa or greater, and more specifically 20 kMPa or greater The article described herein has many uses. The article can be used wherever cooling is needed, for example, in electrical components, motors, engines, and the like. The article also can be used in harsh thermal or chemical environments due to the highly resilient polymer and filler materials of the thermoelectric composite. Moreover, the article is usable at high temperatures even where other polymer containing materials fail. Applications of the article include cooling of electric submersible pump motors, monitor while drilling (MWD) reservoir sensing electronics, and the like. Other uses include, but are not limited to cooling and remote power for devices and tools. As an example, the article can be disposed in an environment at an elevated temperature with a voltage applied to the article to cool the environment proximate to the article. One such example is a downhole environment, where the article could be used to cool or power downhole tools and sensors. The temperature of the downhole environment can be up to the degradation temperature of the article. Exemplary applications of the article include a motor cover, borehole casing liner, current source element, voltage source element, cooler, sensor cover, or a combination thereof.

The thermoelectric composite, articles, and methods are further illustrated by the following non-limiting examples.

Figure 8:
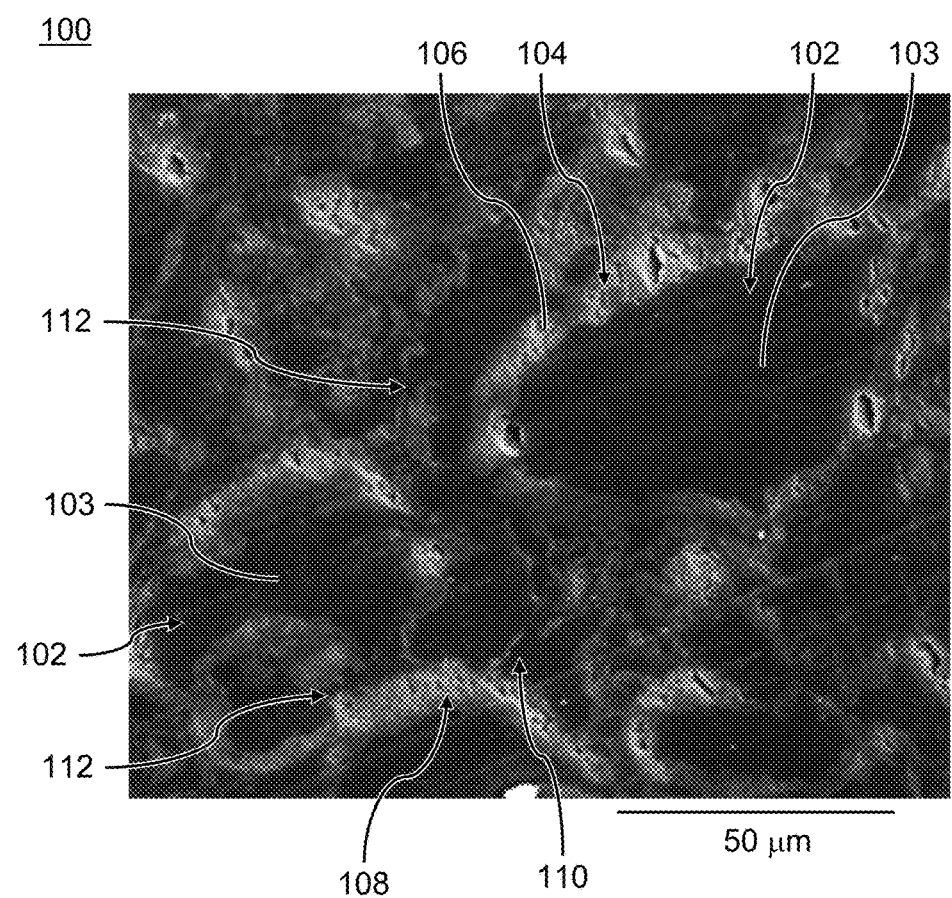
FIG. 8 shows an electron micrograph of a cross-section of a thermoelectric composite according to an embodiment described herein.

Example 1. A thermoelectric composite having a rectangular shape was prepared by compression molding particles of polyphenylene sulfide and conductive carbon black at 350° C. The carbon black was present in amount of 10 wt % based on the total weight the composite. The polyphenylene sulfide particles were free of any second filler material. The article was allowed to cool to room temperature and then de-molded. The article was 6 cm in length and width and had a height of the 2 cm. FIG. 8 shows an electron micrograph of the thermoelectric composite 100 having particle 102 that include polyphenylene sulfide 103. A segregated network 104 contains the carbon black first filler material 106. The segregated network 104 exhibits areas of high concentration 108 of the first filler material 106 and area of low concentration 110 of the first filler material 106. Additionally, the segregated network also has a discontinuity 112 in the first filler material 106. The electrical conductivity of the composite was found to be 1 S/m as determined by the method described in Pang et al., Materials Letters 64, 2226-2229 (2010) that uses copper sheets disposed on opposing surfaces of a sample of composite with good electrical contact at the surfaces. A current was passed through the sample via an electrode to measure the voltage output and the corresponding resistance. The conductivity was calculated based on a pro-rated dimension.

Example 2. An article having a rectangular shape was prepared by compression molding particles of polyphenylene sulfide and carbon fiber coated with nickel at 350° C. The polyphenylene sulfide particles were free of any second filler material. The article was allowed to cool to room temperature and then de-molded. The article was 6 cm in length and width and had a height of the 2 cm. Electrodes were disposed on the article by applying conductive silver paint to opposing surfaces of the article. Thereafter, the article was subjected to electrical and thermal tests. The electrical conductivity of the article was 600 S/m, and the through-plane thermal conductivity of the article was 1.5 W/m·K as determined by a thermal conductivity probe available from Thermtest Inc. equipped with a HOT DISK thermal constants analyzer.

Figure 9:
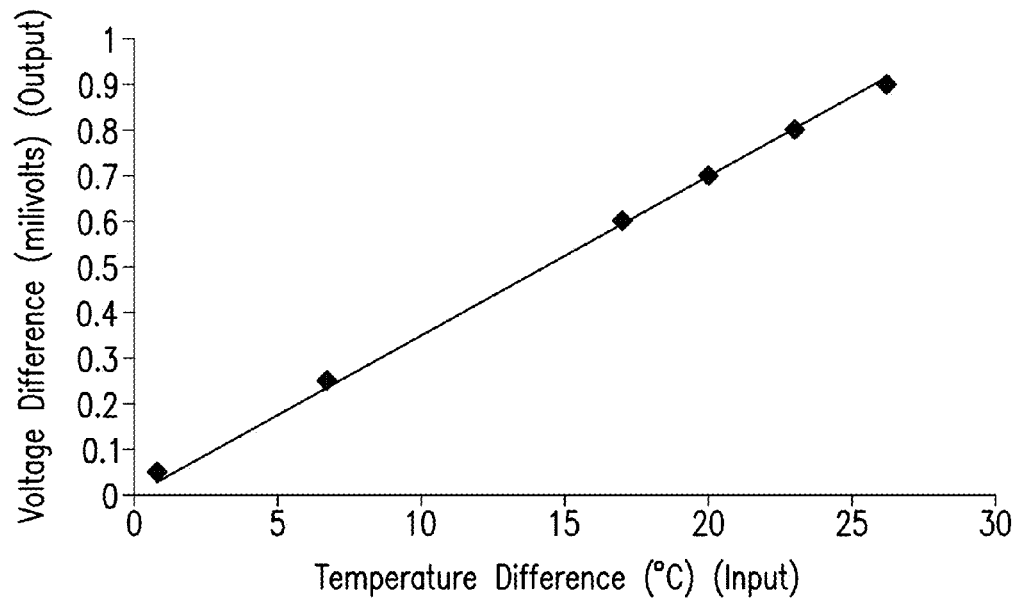
FIG. 9 shows a graph of voltage difference versus temperature difference for a thermoelectric article having terminals attached to a thermoelectric composite.

To determine the voltage response of the article, the article was maintained at a specific temperature gradient by an electrically powered heat source block placed on top of the article and a large metal block at the bottom as a heat sink, for each voltage measurement. The voltage difference across the article was measured as a function of the temperature difference between the opposing surfaces (top and bottom) of the article, and the results are plotted in FIG. 9. A least squares analysis of the data resulted in a Seebeck Coefficient (S) of S=35·µV/K.

Figure 10:
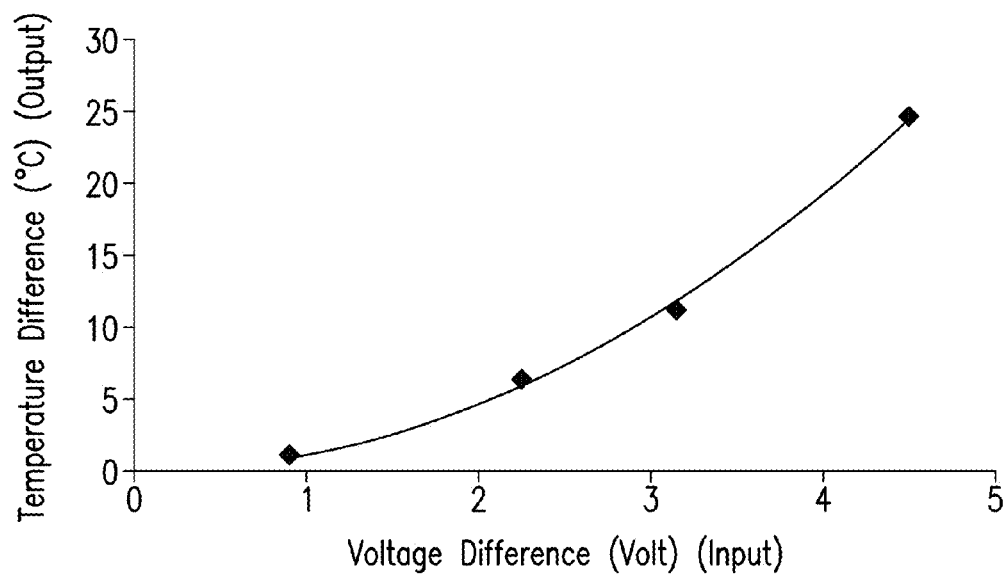
FIG. 10 shows a graph of temperature difference versus voltage difference for a thermoelectric article having terminals attached to a thermoelectric composite.

The Peltier effect of the same article was determined by biasing the article at various voltages using a calibrated power supply. The temperature at each end of the cylindrically shaped article was measured using a thermocouple. Analysis of the data shown in FIG. 10 established that the cooling efficiency of the article was 25° C./A.

Example 3. Three samples of a PPS thermoelectric composite containing various types of fillers and one sample of a PEEK thermoelectric composite were prepared. The initial Seebeck coefficient of each sample was determined by contacting copper sheets on opposing surfaces of a molded block of PEEK with good thermal and electrical contact between each copper sheet and the block. A temperature difference was established between the top and bottom surfaces using a jacketed heat source at the top surface. The output voltage gradient of the block was measured between the two surfaces using a multimeter. The temperature gradient across the block was acquired using thermocouples installed at both surfaces. Thereafter, the samples were placed in a container containing a 3 wt % KCl brine solution at 200° C. The samples were aged in the brine solution for two days and then removed and allowed to dry. The volumetric swelling and density change of the samples were determined by water displacement method using an electronic densimeter. Additionally, the Seebeck coefficient was determined for the post-aged samples. Values for all determinations are listed in Table 1.

TABLE 1

| Thermoelectric Composite | Initial Seebeck Coefficient ($\mu V\ K^{-1}$) | Post-aging Seebeck Coefficient ($\mu V\ K^{-1}$) | Volume Swell Percentage (%) | Density Change Percentage (%) |
|---|---|---|---|---|
| PPS/40 wt % Ni coated carbon fiber | 19.3 | 20.5 | 0 | 0.29 |
| PPS/40 wt % carbon fiber | 12.8 | 12.2 | 0.97 | 0.37 |
| PPS/45 wt % Ni flake | 23.6 | 23.5 | 0 | 0.4 |
| PEEK/40 wt % Ni coated carbon fiber | 19.7 | 20.8 | −2.87 | 0.31 |

The data in Table 1 illustrate that the thermoelectric composites exhibit small changes in their respective Seebeck coefficient after aging at an elevated temperature in an aqueous brine solution. Notably, for PPS with 45 wt % Ni flakes, the Seebeck coefficient changed by only 0.4%, showing a great stability for high temperature, aqueous applications. Further, all samples were resistant to volumetric and density changes in the aqueous solution at 200° C.

Table 2 includes data for aging similar samples in a Norsok hydrocarbon composition that includes 70 vol % heptane, 20 vol % cyclohexane, and 10 vol % toluene, based on the total volume of the Norsok hydrocarbon composition, at pH 10.

TABLE 2

| Composite | Initial Seebeck Coefficient ($\mu V\ K^{-1}$) | Post-aging Seebeck Coefficient ($\mu V\ K^{-1}$) | Volume Swell Percentage (%) | Density Change Percentage (%) |
|---|---|---|---|---|
| PPS/40 wt % Ni coated carbon fiber | 19.3 | 18.7 | 1.1 | −1.5 |
| PPS/40 wt % carbon fiber | 12.8 | 11.7 | 1 | −1 |
| PPS/45 wt % Ni flake | 23.6 | 16.6 | 0.7 | −1.4 |
| PEEK/40 wt % Ni coated carbon fiber | 19.7 | 19.2 | 1.3 | −0.8 |

The data in Table 2 illustrate that the thermoelectric composites are quite stable after aging at an elevated temperature in hydrocarbons. Here, for 40 wt % Ni coated carbon fiber in PEEK or PPS, the Seebeck coefficient changed by less than 3.5%, and all samples showed resistance to volumetric and density changes in hydrocarbon fluids at 200° C.

Figure 11:
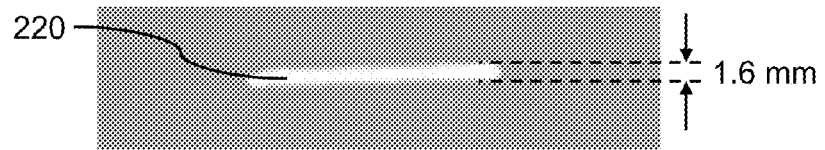
FIG. 11 shows a computer aided tomography image of a thermoelectric composite.

Example 4. A thermoelectric composite containing a nickel metal foam and PPS was prepared by placing a nickel foam in a mold and placing PPS powder on top of the nickel foam. A cover was placed on the mold containing the combination of nickel foam and PPS powder, and the mold was heated at 350° C. for 3 hours. The mold was cooled to room temperature and compressed under a 3000 psi load to form the PPS/Ni foam thermoelectric composite. After removing the load, the thermoelectric composite was removed from the mold. A computer aided tomography (CT) scan was performed on the thermoelectric composite, and the image is shown in FIG. 11, wherein the thickness of the composite 220 is indicated as 1.6 mm.

Figure 12:
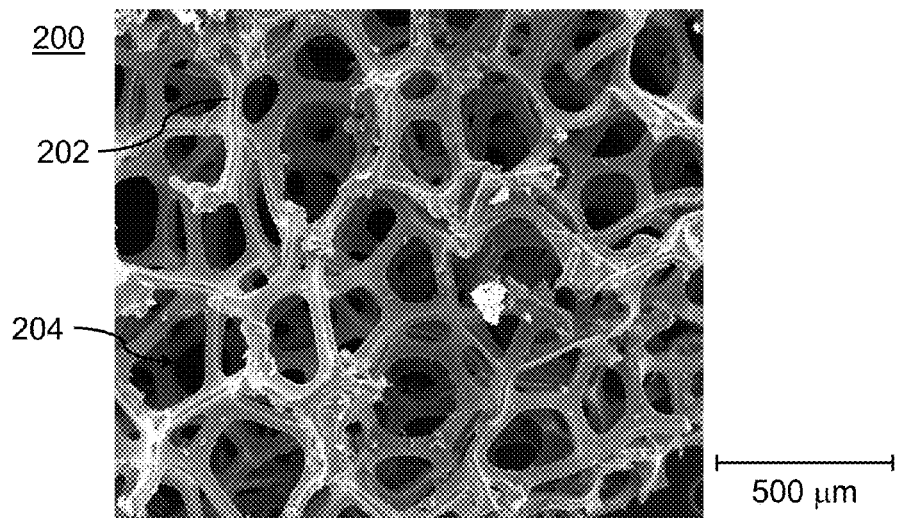
FIG. 12 shows an electron microscope micrograph of an open cell Ni foam.

The original nickel foam was subjected to electron microscopy before molding, and the micrograph is shown in FIG. 12. The metal foam 200 has a network of interconnected metal 202 and a plurality of pores 204. Additionally, an electron micrograph of a cross-section of the thermoelectric composite 220 is shown FIG. 13. Here, the thermoelectric composite 220 includes metal network 222 with crosslinked PPS 224 filling pores 226 within the metal network 222. It should be noted that the metal maintains its network structure as indicated by the dotted lines 228 in FIG. 13.

While one or more embodiments have been shown and described, modifications and substitutions may be made thereto without departing from the spirit and scope of the invention. Accordingly, it is to be understood that the present invention has been described by way of illustrations and not limitation. Embodiments herein are can be used independently or can be combined.

All ranges disclosed herein are inclusive of the endpoints, and the endpoints are independently combinable with each other. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive, rather the elements can be used separately or can be combined together under appropriate circumstances.

What is claimed is:

1. A process for preparing a thermoelectric article, the process comprising: combining a first filler material and a plurality of particles comprising a polymer to form a composition; crosslinking the polymer to provide a crosslinked polymer; and molding the composition to form a thermoelectric article comprising a thermoelectric composite, wherein the first filler material comprises a metal disposed on a carbon material, the carbon material comprising carbon fiber, carbon nanotubes, carbon black, graphite, graphene or a combination thereof; the polymer comprises polyphenylene sulfide, polyphenylene sulfone, self-reinforced polyphenylene, polyether sulfone, polyetherether ketone, polytetrafluoroethylene, polyaryletherketones, polyphenylene sulfone ureas, or a combination thereof, and the thermoelectric article is configured to produce a thermoelectric response in response to application of a voltage difference or temperature difference across the article.

2. The process of claim 1, wherein crosslinking the polymer comprises heating the plurality of particles comprising the polymer to crosslink the polymer in individual particles.

3. The process of claim 1, wherein molding comprises:
applying pressure to the composition; and
heating the composition to crosslink the polymer and to form the crosslinked polymer,
wherein the crosslinked polymer is disposed in the metal in response to applying the pressure.

4. The process of claim 1, further comprising contacting the thermoelectric article with a terminal, the terminal being configured to transmit electrical current, apply voltage across a portion of the thermoelectric article, or a combination thereof.

5. The process of claim 1, wherein the crosslinked polymer has a heat deflection temperature greater than or equal to 200° F. (93° C.).

6. The process of claim 1, wherein the metal comprises cadmium, chromium, cobalt, brass, iridium, iron, lead, molybdenum, nickel, platinum, ruthenium steel, selenium, tin, titanium, tungsten, vanadium, zinc, or a combination thereof, and the metal is a foam, solid, flake, chip, powder, turnings, or a combination thereof.

7. The process of claim 1, wherein the first filler material comprises nickel coated carbon fiber.

8. The process of claim 1, wherein the plurality of particles further comprises a second filler material disposed among the crosslinked polymer, and the second filler material comprises a carbon material, a metal, a metal disposed on a carbon material, or a combination thereof.

9. The process of claim 1, wherein the first filler material is present in an amount from 0.1 wt. % to 70 wt. %, based on the weight of the polymer.

10. The process of claim 1, wherein the metal disposed on the carbon material is present in an amount from 0.5 wt. % to 30 wt. %, based on the weight of the carbon material.

11. The process of claim 1, wherein the thermoelectric composite has a thermal decomposition temperature greater than 350° C.

12. The process of claim 1, wherein the polymer has an electrical conductivity from $10^{-15}$ Siemens per meter (S/m) to $10^{-11}$ S/m.

13. The process of claim 1, wherein the thermoelectric composite has an electrical conductivity from $10^3$ to $10^4$ S/m and a thermal conductivity from 0.2 Watt per meter per Kelvin (W/m·K) to 2.5 W/m·K.

14. The process of claim 1, wherein the thermoelectric composite has a Seebeck coefficient from 10 microvolts per Kelvin (μV/K) to 60 μV/K.

15. The process of claim 1, wherein the thermoelectric composite has a cooling efficiency from 1 degree Celsius per amp (° C./A) to 30° C./A.

16. The process of claim 1, wherein the article has a first terminal disposed at first position of the article; and a second terminal disposed at a second position of the article, and the article is configured to flow an electrical current through the first terminal and second terminal and through the article between the first position and second position.

17. The process of claim 16, wherein the electrical current is produced in response to a temperature difference between the first position and the second position.

* * * * *